United States Patent
Lu et al.

(10) Patent No.: US 8,815,723 B2
(45) Date of Patent: Aug. 26, 2014

(54) PROCESS FOR ENHANCING IMAGE QUALITY OF BACKSIDE ILLUMINATED IMAGE SENSOR

(75) Inventors: Shou Shu Lu, Kaohsiung (TW); Hsun-Ying Huang, Tainan (TW); I-Chang Lin, Tainan (TW); Chia-Chi Hsiao, Changhua County (TW); Yung-Cheng Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 257 days.

(21) Appl. No.: 13/335,817

(22) Filed: Dec. 22, 2011

(65) Prior Publication Data

US 2013/0084660 A1 Apr. 4, 2013

Related U.S. Application Data

(63) Continuation-in-part of application No. 13/249,591, filed on Sep. 30, 2011, now abandoned.

(51) Int. Cl.
*H01L 21/22* (2006.01)
*H01L 27/146* (2006.01)

(52) U.S. Cl.
CPC ...... *H01L 27/14643* (2013.01); *H01L 27/1464* (2013.01); *H01L 27/14687* (2013.01)
USPC ............. 438/542; 438/98; 438/292; 438/666; 438/690; 438/691; 438/692; 257/291; 257/292; 257/460; 257/E21.53; 257/E21.135; 257/E31.113

(58) Field of Classification Search
CPC ................. H01L 27/1464; H01L 27/14643; H01L 27/14687
USPC ................... 438/98, 292, 542, 666, 690, 691; 257/291, 292, 460, E21.53, E21.135, 257/E31.113
See application file for complete search history.

(56) References Cited

U.S. PATENT DOCUMENTS

| | | | |
|---|---|---|---|
| 7,863,067 B2 | 1/2011 | Shiau et al. | |
| 2008/0124930 A1* | 5/2008 | Lim et al. | 438/692 |
| 2008/0227276 A1* | 9/2008 | Shiau et al. | 438/542 |
| 2009/0200585 A1* | 8/2009 | Nozaki et al. | 257/292 |
| 2011/0260221 A1* | 10/2011 | Mao et al. | 257/291 |

FOREIGN PATENT DOCUMENTS

TW 2010-30956 8/2010

* cited by examiner

*Primary Examiner* — Dao H Nguyen
(74) *Attorney, Agent, or Firm* — Haynes and Boone, LLP

(57) ABSTRACT

A method of forming an image sensor device includes forming a light sensing region at a front surface of a silicon substrate and a patterned metal layer there over. Thereafter, the method also includes performing an ion implantation process to the back surface of the silicon substrate and performing a green laser annealing process to the implanted back surface of the silicon substrate. The green laser annealing process uses an annealing temperature greater than or equal to about 1100° C. for a duration of about 100 to about 400 nsec. After performing the green laser annealing process, a silicon polishing process is performed on the back surface of the silicon substrate.

19 Claims, 9 Drawing Sheets

PROCESS FOR ENHANCING IMAGE QUALITY OF BACKSIDE ILLUMINATED IMAGE SENSOR

The present patent is a continuation-in-part of U.S. Ser. No. 13/249,591 filed Sep. 30, 2011, the disclosure of which is hereby incorporated by reference.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge—for example, the more light, the higher the charge. The accumulated charge is then used (for example, by other circuitry) to provide a color and brightness for use in a suitable application, such as a digital camera. One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a high fill factor and reduced destructive interference, as compared to front-side illuminated (FSI) image sensor devices. Due to device scaling, improvements to BSI technology are continually being made to further improve image quality of BSI image sensor devices. Although existing BSI image sensor devices and methods of fabricating BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
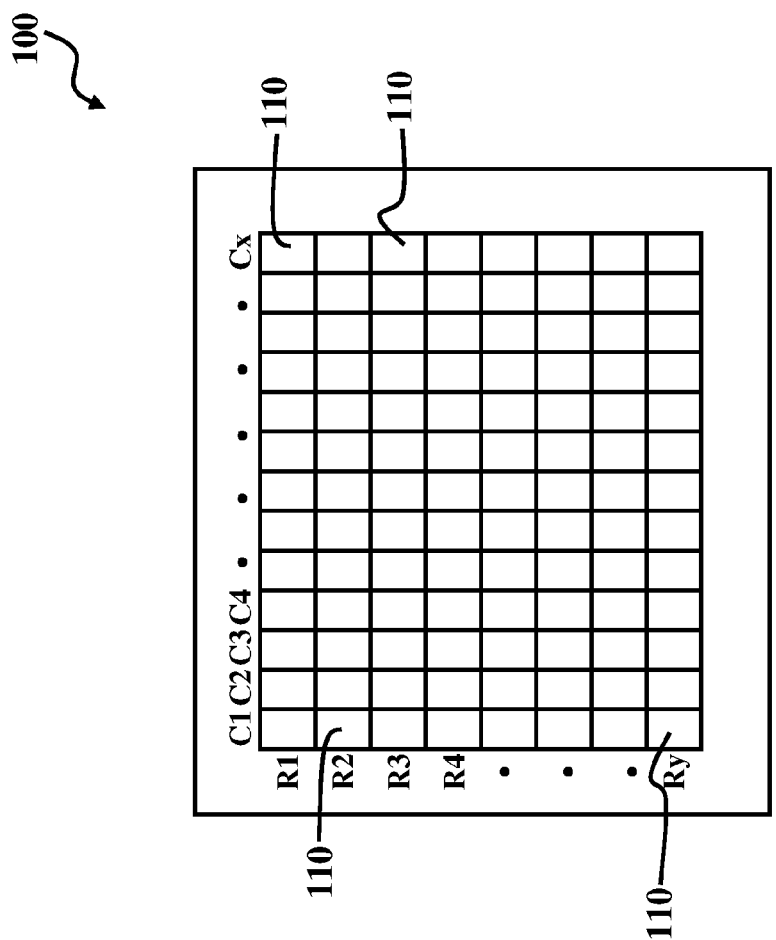
FIG. 1 is a top view of an image sensor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a top view of an image sensor device 100 according to various aspects of the present disclosure. In the depicted embodiment, the image sensor device is a backside illuminated (BSI) image sensor device. The image sensor device 100 includes an array of pixels 110. Each pixel 110 is arranged into a column (for example, C1 to Cx) and a row (for example, R1 to Ry). The term "pixel" refers to a unit cell containing features (for example, a photodetector and various circuitry, which may include various semiconductor devices) for converting electromagnetic radiation to an electrical signal. The pixels 110 may include photodiodes, complementary metal-oxide-semiconductor (CMOS) image sensors, charged coupling device (CCD) sensors, active sensors, passive sensors, other sensors, or combinations thereof. As such, the pixels 110 may comprise conventional and/or future-developed image sensing devices. The pixels 110 may be designed having various sensor types. For example, one group of pixels 110 may be CMOS image sensors and another group of pixels 110 may be passive sensors. Moreover, the pixels 110 may include color image sensors and/or monochromatic image sensors. In an example, each pixel 110 is an active pixel sensor, such as a complementary metal-oxide-semiconductor (CMOS) image sensor. In the depicted embodiment, each pixel 110 may include a photodetector, such as a photogate-type photodetector, for recording an intensity or brightness of light (radiation). Each pixel 110 may also include various semiconductor devices, such as various transistors including a transfer transistor, a reset transistor, a source-follower transistor, a select transistor, other suitable transistor, or combinations thereof. Additional circuitry, input, and/or output may be coupled to the pixel array to provide an operation environment for the pixels 110 and support external communications with the pixels 110. For example, the pixel array may be coupled with readout circuitry and/or control circuitry. For simplicity, image sensor devices including a single pixel are described in the present disclosure; however, typically an array of such pixels may form the image sensor device 100 illustrated in FIG. 1.

Figure 2:
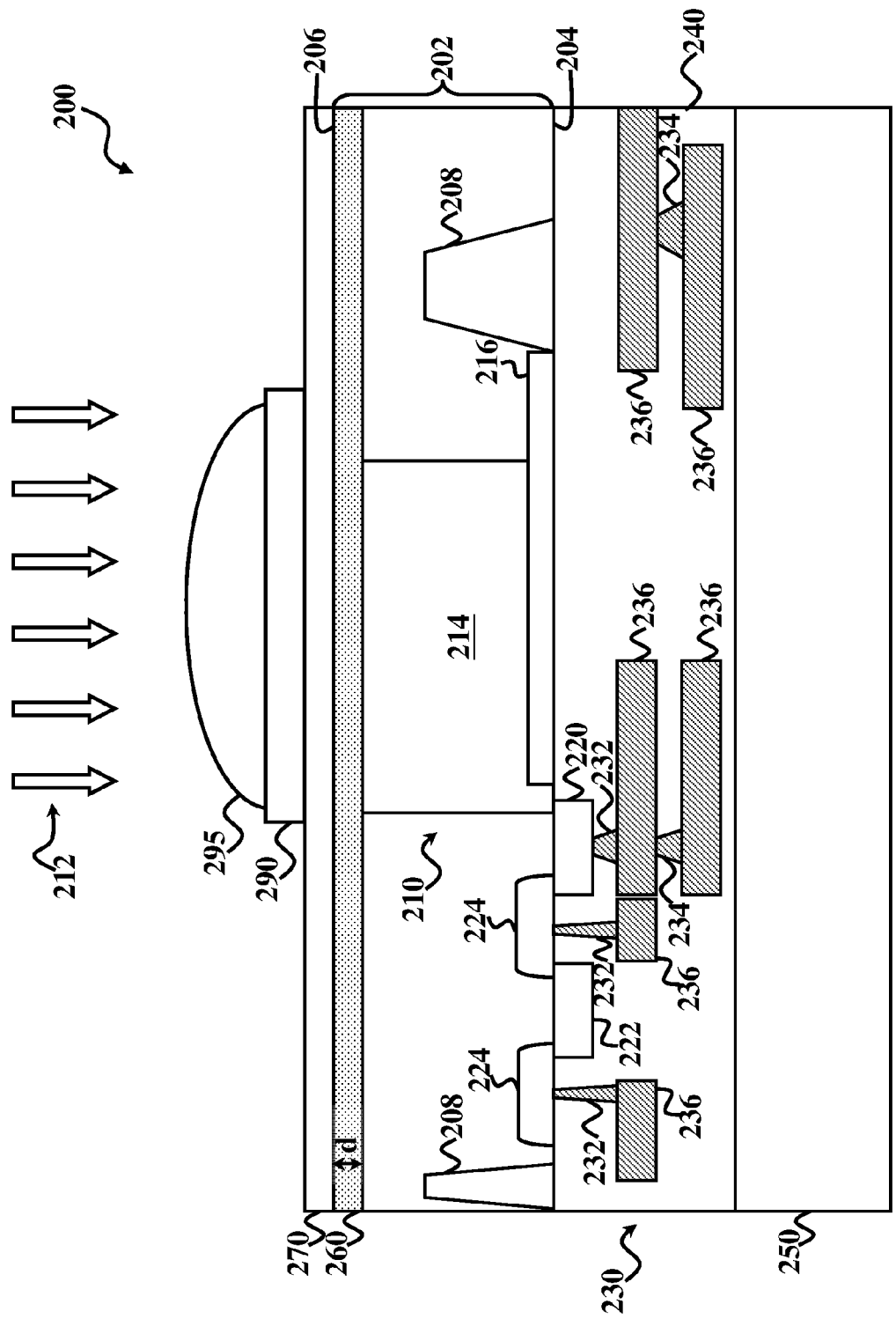
FIG. 2 is a diagrammatic sectional side view of an integrated circuit device including an image sensor device sensor element according to various aspects of the present disclosure.

FIG. 2 is a diagrammatic cross-sectional view of an integrated circuit device 200 according to various aspects of the present disclosure. In the depicted embodiment, integrated circuit device 200 includes a backside illuminated (BSI) image sensor device. The integrated circuit device 200 may be an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, fin-like field effect transistors (FinFETs), other suitable components, or combinations thereof. FIG. 2 has been simplified for the sake of clarity to better understand the inventive concepts of the present disclosure. Additional features can be added in the integrated circuit device 200, and some of the features described below can be replaced or eliminated for other embodiments of the integrated circuit device 200.

In FIG. 2, the integrated circuit device 200 includes a substrate 202 having a front surface 204 and a back surface 206. In the depicted embodiment, the substrate 202 is a semiconductor substrate including silicon. Alternatively or additionally, the substrate 202 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may be a semiconductor on insulator (SOI). The substrate 202 may include a doped epi layer, a gradient semiconductor layer, and/or a semiconductor layer overlying another semiconductor layer of a different type, such as a silicon layer on a silicon germanium layer. In the depicted embodiment, the substrate 202 is a p-type substrate. P-type dopants that the substrate 202 are doped with include boron, gallium, indium, other suitable p-type dopants, or combinations thereof. Because the depicted integrated circuit device 200 includes a p-type doped substrate, doping configurations described below should be read consistent with a p-type doped substrate. The substrate 202 may alternatively be an n-type doped substrate, in which case, the doping configurations described below should be read consistent with an n-type doped substrate (for example, read with doping configurations having an opposite conductivity). N-type dopants that the substrate 202 can be doped with include phosphorus, arsenic, other suitable n-type dopants, or combinations thereof. The substrate 202 may include various p-type doped regions and/or n-type doped regions. Doping may be implemented using a process such as ion implantation or diffusion in various steps and techniques.

The substrate 202 includes isolation features 208, such as local oxidation of silicon (LOCOS) and/or shallow trench isolation (STI), to separate (or isolate) various regions and/or devices formed on or within the substrate 202. For example, the isolation features 208 isolate a sensor element 210 from adjacent sensor elements. In the depicted embodiment, the isolation features 208 are STIs. The isolation features 208 include silicon oxide, silicon nitride, silicon oxynitride, other insulating material, or combinations thereof. The isolation features 208 are formed by any suitable process. As one example, forming an STI includes a photolithography process, etching a trench in the substrate (such as by using a dry etching, wet etching, or combinations thereof), and filling the trench (for example, by using a chemical vapor deposition process) with one or more dielectric materials. In an example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

As noted above, the integrated circuit device 200 includes the sensor element (or sensor pixel) 210. The sensor element 210 detects an intensity (brightness) of radiation, such as incident radiation (light) 212, directed toward the back surface 206 of the substrate 202. The incident radiation is visual light. Alternatively, the radiation 212 is infrared (IR), ultraviolet (UV), x-ray, microwave, other suitable radiation type, or combinations thereof. The sensor element 210 may be configured to correspond with a specific light wavelength, such as a red, a green, or a blue light wavelength. In other words, the sensor element 210 may be configured to detect an intensity (brightness) of a particular light wavelength. In the depicted embodiment, the sensor element 210 is a pixel, which may be in a pixel array, such as the pixel array illustrated in FIG. 1. In the depicted embodiment, the sensor element 210 includes a photodetector, such as a photodiode, that includes a light-sensing region (or photo-sensing region) 214 and a pinned layer 216. The light-sensing region (or photo-sensing region) 214 is a doped region having n-type and/or p-type dopants formed in the substrate 202, specifically along the front surface 204 of the substrate 202. In the depicted embodiment, the light-sensing region 214 is an n-type doped region. The light-sensing region 214 is formed by a method such as diffusion and/or ion implantation. The pinned layer 216 is a doped layer disposed at the front surface 204 of the substrate 202. For example, in the depicted embodiment, the pinned layer 216 is a p-type implanted layer. The sensor element 210 further includes various transistors, such as a transfer transistor associated with a transfer gate 220, a reset transistor associated with a reset gate 222, a source-follower transistor (not illustrated), a select transistor (not illustrated), other suitable transistors, or combinations thereof. The light-sensing region 214 and various transistors (which can collectively be referred to as pixel circuitry) allow the sensor element 210 to detect intensity of the particular light wavelength. Additional circuitry, input, and/or outputs may be provided to the sensor element 210 to provide an operation environment for the sensor element 210 and/or support communication with the sensor element 210.

The transfer gate 220 and the reset gate 222 are disposed over the front surface 204 of the substrate 202. The transfer gate 220 interposes a source/drain region 224 of the substrate 202 and the light-sensing region 214, such that a channel is defined between the source/drain region 224 and the light-sensing region 214. The reset gate 222 interposes source/drain regions 224 of the substrate 202, such that a channel is defined between two source/drain regions 224. In the depicted embodiment, the source/drain regions 224 are N+ source/drain diffusion regions. The source/drain regions 224 may be referred to as floating diffusion regions. The transfer gate 220 and reset gate 222 include a gate stack having a gate dielectric layer and a gate electrode. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other high-k dielectric material, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive material, or combinations thereof. The gate stacks may include numerous other layers, for example, capping layers, interface layers, diffusion layers, barrier layers, or combinations thereof. The transfer gate 220 and reset gate 222 may include spacers disposed on the sidewalls of the gate stacks. The spacers include a dielectric material, such as silicon nitride, silicon oxynitride, other suitable material, or combinations thereof. The spacers may include a multi-layer structure, such as a multi-layer structure including a silicon nitride layer and a silicon oxide layer. The transfer gate 220 and the reset gate 222 are formed by a suitable process, including deposition, lithography patterning, and etching processes.

The integrated circuit device 200 further includes a multi-layer interconnect (MLI) 230 disposed over the front surface 204 of the substrate 202, including over the sensor element 210. The MLI 230 is coupled to various components of the BSI image sensor device, such as the sensor element 210, such that the various components of the BSI image sensor device are operable to properly respond to illuminated light (imaging radiation). The MLI 230 includes various conductive features, which may be vertical interconnects, such as contacts 232 and/or vias 234, and/or horizontal interconnects, such as lines 236. The various conductive features 232, 234, and 236 include conductive materials, such as metal. In an example, metals including aluminum, aluminum/silicon/copper alloy, titanium, titanium nitride, tungsten, polysilicon, metal silicide, or combinations thereof, may be used, and the various conductive features 232, 234, and 236 may be referred to as aluminum interconnects. Aluminum interconnects may be formed by a process including physical vapor deposition (PVD), chemical vapor deposition (CVD), or combinations thereof. Other manufacturing techniques to form the various conductive features 232, 234, and 236 may include photolithography processing and etching to pattern conductive materials to form the vertical and horizontal connects. Still other manufacturing processes may be implemented to form the MLI 230, such as a thermal annealing to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 232, 234, and 236 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. The MLI 230 is not limited by the number, material, size, and/or dimension of the conductive features 232, 234, 336 depicted, and thus, the MLI 230 may include any number, material, size, and/or dimension of conductive features depending on design requirements of the integrated circuit device 200.

The various conductive features 232, 234, and 236 of the MLI 230 are disposed in an interlayer (or inter-level) dielectric (ILD) layer 240. The ILD layer 240 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable material, or combinations thereof. The ILD layer 240 may have a multi-layer structure. The ILD layer 240 may be formed by a technique including spin-on coating, CVD, sputtering, or other suitable process. In an example, the MLI 230 and ILD 240 may be formed in an integrated process including a damascene process, such as a dual damascene process or single damascene process.

A carrier wafer 250 is disposed over the front surface 204 of the substrate 202. In the depicted embodiment, the carrier wafer 250 is bonded to the MLI 230. The carrier wafer 250 includes silicon. Alternatively, the carrier wafer 250 includes another suitable material, such as glass. The carrier wafer 250 can provide protection for the various features (such as the sensor element 210) formed on the front surface 204 of the substrate 202, and can also provide mechanical strength and support for processing the back surface 206 of the substrate 202.

A doped layer 260 is disposed at the back surface 206 of the substrate 202. The doped layer 260 is formed by an implantation process, diffusion process, annealing process, other process, or combinations thereof. In the depicted embodiment, the doped layer 206 includes p-type dopants, such as boron, and may be a P+ doped layer. The doped layer 206 may include other p-type dopants, such as gallium, indium, other p-type dopants, or combinations thereof. Alternatively, the doped layer 206 includes n-type dopants, such as phosphorus, arsenic, other n-type dopants, or combinations thereof. The doped layer 206 has a dopant depth, d, that extends into the substrate 202 from the back surface 206 of the substrate 202. The dopant depth, dopant concentration, dopant profile, or combination thereof of the doped layer 260 may be selected to optimize image quality provided by the image sensor device of the integrated circuit device 200. For example, the dopant depth, dopant concentration, dopant profile, or combination thereof may be optimized to increase quantum efficiency (ratio of number of carriers generated to number of photons incident upon an active region of the image sensor device) and/or reduce dark current (current that flows in the image sensor device in absence of incident light on the image sensor device) and/or white pixel defects (where the image sensor device includes an active region that has an excessive amount of current leakage).

The integrated circuit device 200 further includes features disposed over the back surface 206 of the substrate 202. For example, an antireflective layer 270, a color filter 290, and a lens 295 are disposed over the back surface 206 of the substrate 202. In the depicted embodiment, the anti-reflective layer 270 is disposed between the back surface 206 of the substrate 202 and the color filter 290. The antireflective layer 270 includes a dielectric material, such as silicon nitride or silicon oxynitride.

The color filter 290 is disposed over the back surface 206 of the substrate 202, particularly over the antireflective layer 270, and is aligned with the light-sensing region 214 of the sensor element 210. The color filter 290 is designed so that it filters through light of a predetermined wavelength. For example, the color filter 290 may filter through visible light of a red wavelength, a green wavelength, or a blue wavelength to the sensor element 210. The color filter 290 includes any suitable material. In an example, the color filter 290 includes a dye-based (or pigment-based) polymer for filtering out a specific frequency band (for example, a desired wavelength of light). Alternatively, the color filter 290 includes a resin or other organic-based material having color pigments.

The lens 295, disposed over the back surface 206 of the substrate 202, particularly over the color filter 290, and is also aligned with the light-sensing region 214 of the sensor element 210. The lens 295 may be in various positional arrangements with the sensor element 210 and color filter 290, such that the lens 295 focuses the incident radiation 212 on the light sensing region 214 of the sensor element 210. The lens 295 includes a suitable material, and may have a variety of shapes and sizes depending on an index of refraction of the material used for the lens and/or a distance between the lens and sensor element 210. Alternatively, the position of the color filter layer 290 and lens layer 295 may be reversed, such that the lens 295 is disposed between the transparent conductive layer 280 and color filter 290. The present disclosure also contemplates the integrated circuit device 200 having a color filter layer disposed between lens layers.

In operation, the integrated circuit device 200 is designed to receive radiation 212 traveling towards the back surface 206 of the substrate 202. The lens 295 directs the incident radiation 212 to the color filter 290. The light then passes from the color filter 290 through the antireflective layer 270 to the substrate 202 and corresponding sensor element 210, specifically to the light sensing region 214. Light passing through to the color filter 290 and sensor element 210 may be maximized since the light is not obstructed by various device features (for example, gates electrodes) and/or metal features (for example, the conductive features 232, 234, and 236 of the MLI 230) overlying the front surface 204 of the substrate 202. The desired wavelength of light (for example, red, green, and blue light) that is allowed to pass through to the light-sensing region 214 of the sensor element 210. When exposed to the light, the light-sensing region 214 of the sensor element 210 produces and accumulates (collects) electrons as long as the transfer transistor associated with transfer gate 220 is in an "off" state. When the transfer gate 220 is in an "on" state, the accumulated electrons (charge) can transfer to the source/drain region (floating diffusion region) 224. A source-follower transistor (not illustrated) may convert the charge to voltage signals. Prior to charge transfer, the source/drain regions 224 may be set to a predetermined voltage by turning on the reset transistor associated with reset gate 222. In an example, the pinned layer 216 and the doped layer 260 may have a same potential, such as a potential of the substrate 202, such that the light-sensing region 214 is fully depleted at a pinning voltage ($V_{PIN}$) and a potential of the sensor element 210 is pinned to a constant value, $V_{PIN}$, when the light-sensing region 214 is fully depleted.

As noted above, the dopant depth, dopant concentration, dopant profile, or combination thereof of the doped layer 260 may be optimized to increase quantum efficiency and/or reduce dark current and/or white pixel defects of the image sensor device. Conventional processing forms the doped layer 260 by performing an ion implantation process to implanting the substrate 202 at the back surface 206 with dopants, such as p-type dopants, and performing an annealing process, such as a rapid thermal annealing (RTA) process or a laser annealing process, to activate the dopants. The laser annealing process is often used because the laser annealing process can provide high energy and power in a shorter time to activate the dopants, thereby efficiently annealing the dopants at the back surface 206 of the substrate 202 while minimizing or eliminating any damage to other features of the integrated circuit device 200, such as melting of metal features. It has been observed that such annealing processes, particularly the laser annealing process, results in surface roughness that can degrade image quality. In other words, surface roughness that arises at the back surface 206 of the substrate 202 during the annealing process used to activate dopants of the doped layer 260 can degrade image quality. For example, the surface roughness may cause a striped pattern in the image produced by the image sensor device. It has further been observed that optimizing process parameters of the annealing process (such as temperature and time of the laser annealing process) have not been as effective as desired at reducing (or eliminating) such surface roughness.

Figure 3:
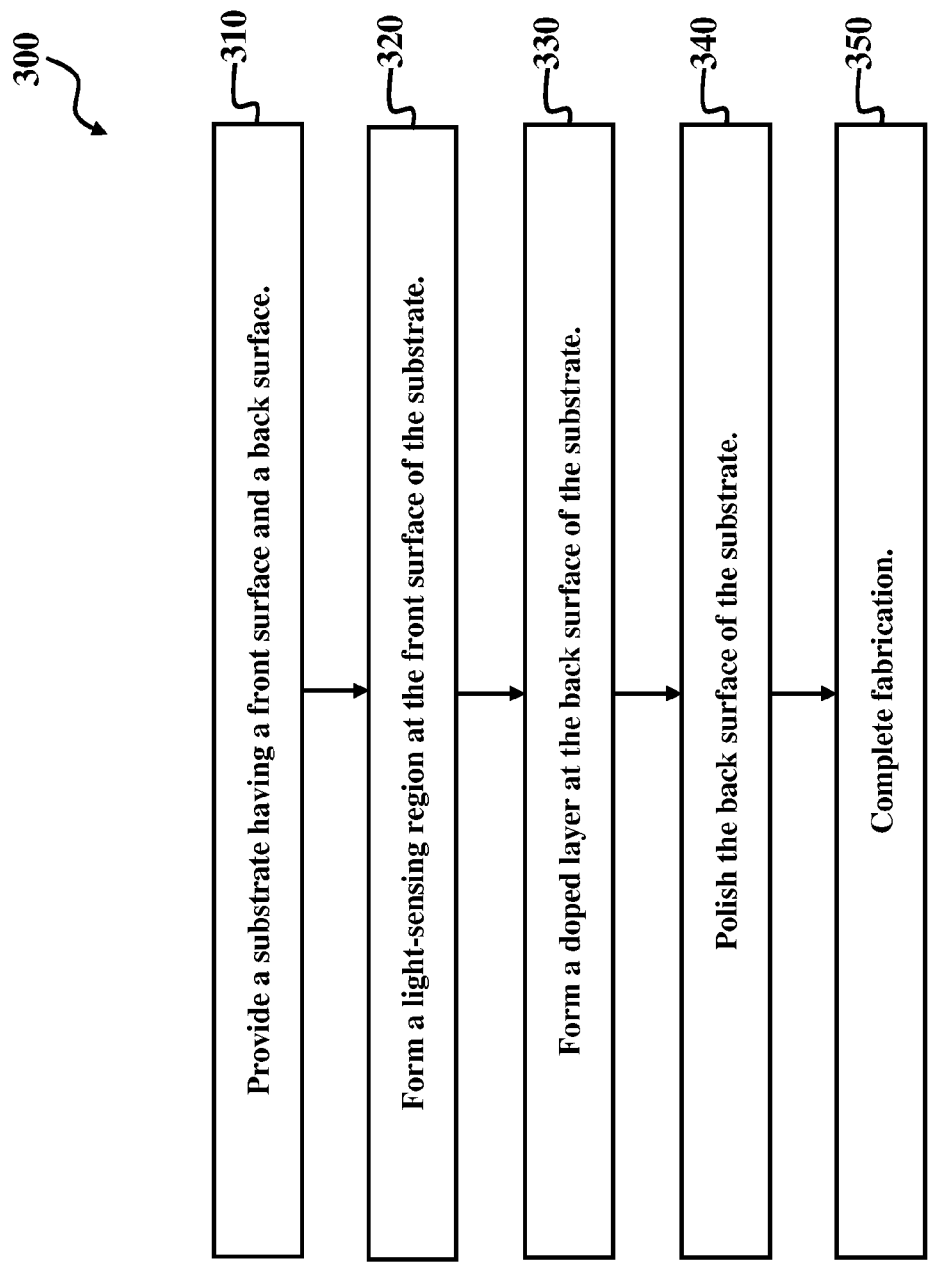
FIG. 3 is a flow chart of a method for fabricating an integrated circuit device including an image sensor device according to various aspects of the present disclosure.

To address the surface roughness issues, the present disclosure proposes polishing a back surface of a substrate of an image sensor device after forming a doped layer at the back surface of the substrate. FIG. 3 is a flow chart of a method for fabricating an integrated circuit device including an image sensor device according to various aspects of the present disclosure. The method 300 begins at block 310 where a substrate having a front surface and a back surface is provided. At block 320, a light-sensing region is formed at the front surface of the substrate. In an example, other portions of the image sensor device are formed at the front surface. At block 330, a doped layer is formed at the back surface of the substrate. In an example, forming the doped layer includes performing an ion implantation process to implant dopants at the back surface of the substrate and performing an annealing process, such as a laser annealing process, to activate the implanted dopants. At block 340, a polishing process is performed on the back surface of the substrate, such that the back surface of the substrate is polished. The polishing process can remove any surface roughness at the back surface of the substrate, such as any surface roughness at the back surface while forming the doped layer. At block 350, the method 300 may continue to complete fabrication of the integrated circuit device. Additional steps can be provided before, during, and after the method 300, and some of the steps described can be replaced or eliminated for additional embodiments of the method 300. The discussion that follows illustrates an integrated circuit device including an image sensor device that can be fabricated according to the method 300 of FIG. 3.

FIGS. 4-9 are various diagrammatic cross-sectional views of an embodiment of an integrated circuit device 400 during various fabrication stages according to the method 300 of FIG. 3. FIGS. 4-9 have been simplified for the sake of clarity to better understand the inventive concepts of the present disclosure. Further, the integrated circuit device 400 of FIGS. 4-9 is similar in many respects to the integrated circuit device 200 of FIG. 2. For example, the integrated circuit device 400 includes a backside illuminated (BSI) image sensor device. Accordingly, for simplicity and clarity, similar features of integrated circuit device 400 and integrated circuit device 200 will be noted without exhaustive explanation of such features with respect to integrated circuit device 400. Additional features can be added in the integrated circuit device 400, and some of the features described below can be replaced or eliminated for additional embodiments of the integrated circuit device 400.

Figure 4:
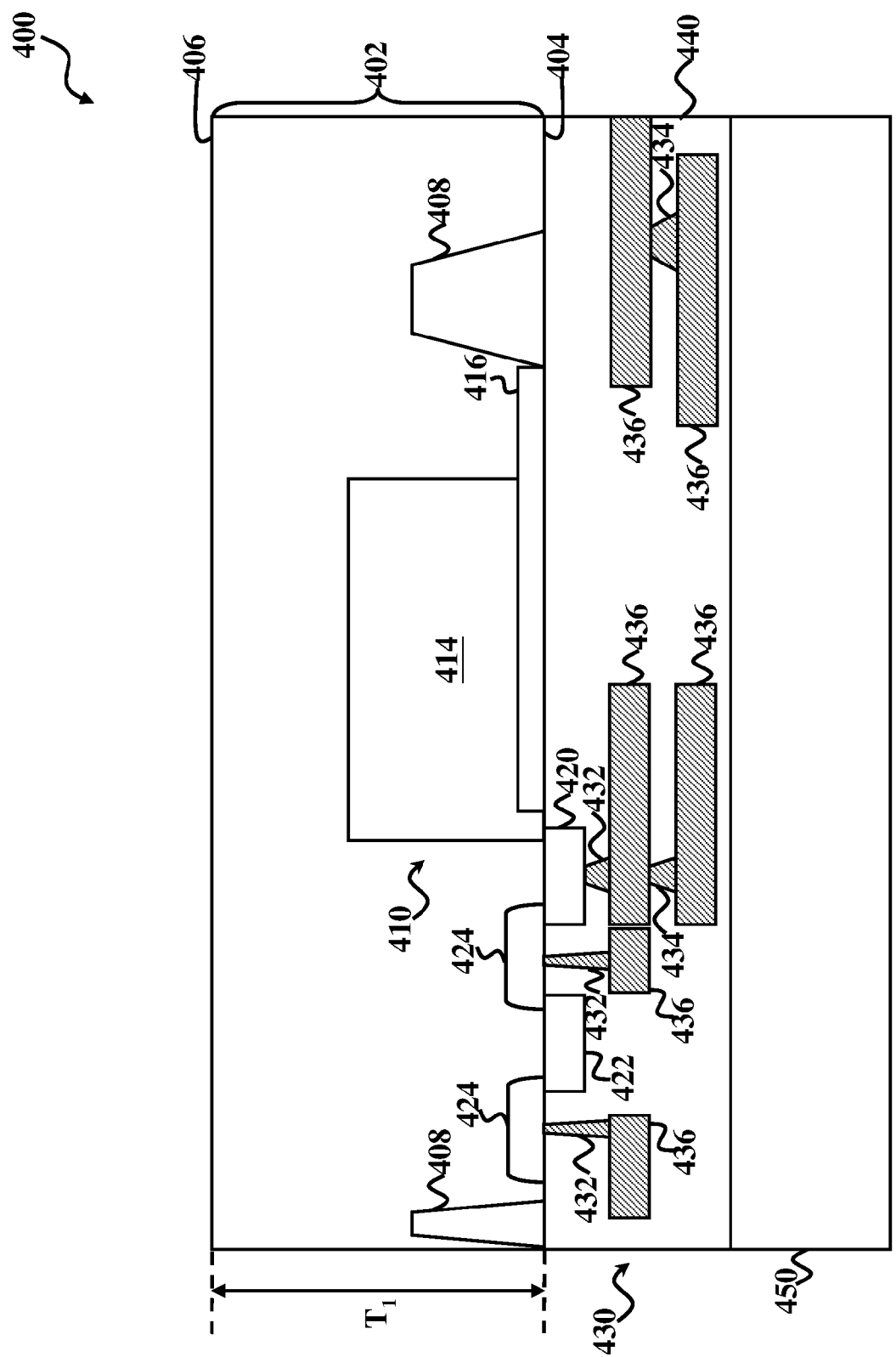
FIGS. 4-9 are diagrammatic cross-sectional views of the integrated circuit device including an image sensor device during various stages of the method of FIG. 3 according to various aspects of the present disclosure.

In FIG. 4, the integrated circuit device 400 includes a substrate 402 having a front surface 404 and a back surface 406, which is similar to the substrate 202 having the front surface 204 and back surface 206 described above. The substrate 402 has a thickness, $T_1$, defined between the front surface 404 and the back surface 406. In an example, the thickness, $T_1$, of the substrate 402 is about 700 µm to about 750 µm.

The integrated circuit device 400 includes various features disposed at the front surface 404 of the substrate 402. For example, the substrate 402 includes isolation features 408, similar to isolation features 208 described above, that isolate a sensor element 410 from adjacent sensor elements. The sensor element 410 is similar to the sensor element 210 described above. For example, the sensor element 410 includes a light-sensing region (or photo-sensing region) 414, a pinned layer 416, and various transistors, such as a transfer transistor associated with a transfer gate 420, a reset transistor associated with a reset gate 422, a source-follower transistor (not illustrated), and a select transistor (not illustrated).

The integrated circuit device 400 includes a multilayer interconnect (MLI) 430 disposed over the front surface 404 of the substrate 402. The MLI 430 includes various conductive features 432, 434, and 436 disposed in an interlayer (or inter-level) dielectric (ILD) layer 440. The MLI 430 (including the various conductive features 432, 434, and 436 disposed in the ILD layer 440) is similar to the MLI 230 (including the various conductive features 232, 234, and 236 disposed in the ILD layer 240) described above. The integrated circuit device 400 further includes a carrier wafer 450, which is similar to the carrier wafer 250 described above.

Figure 5:
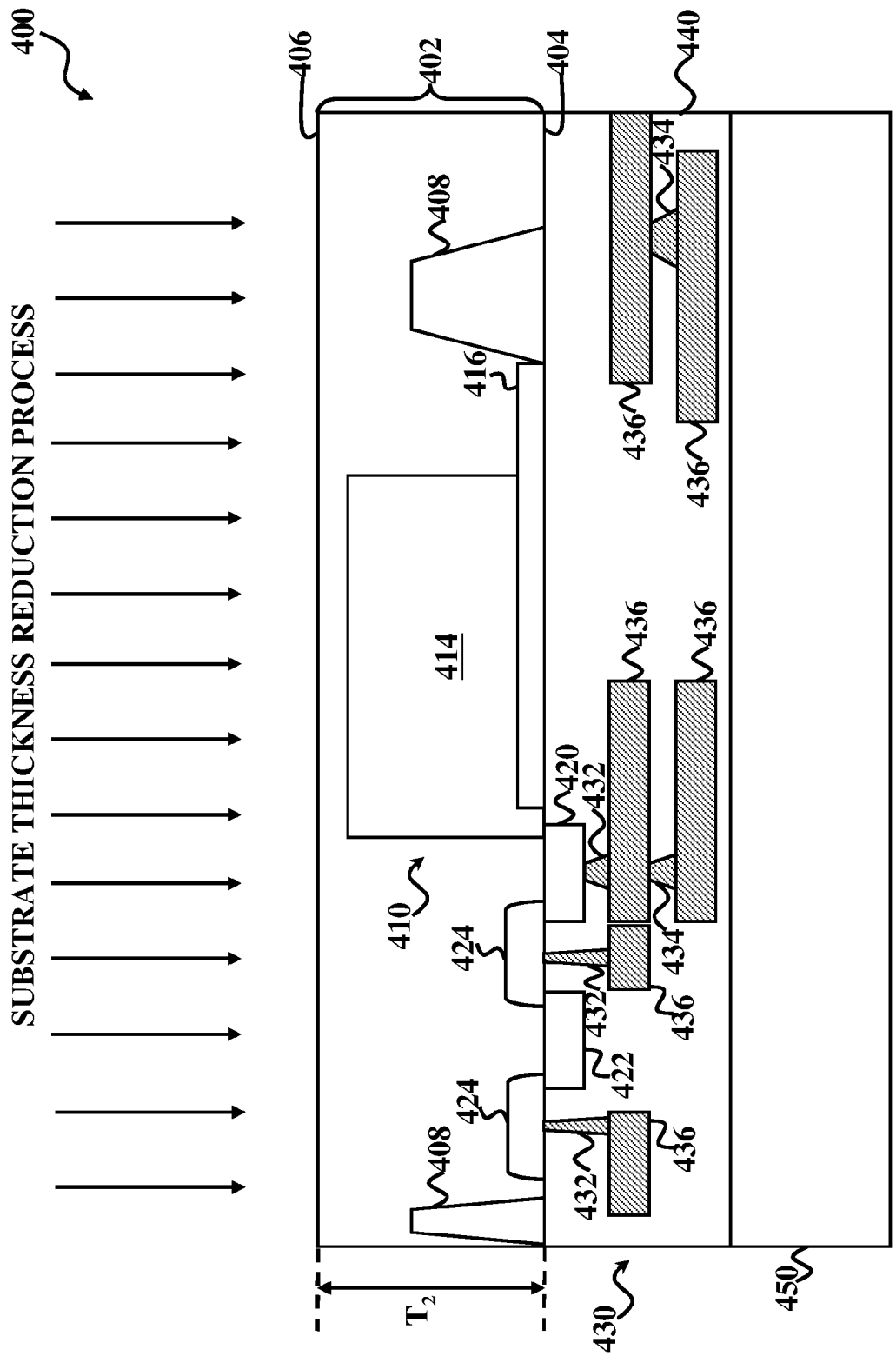

In FIG. 5, a substrate thickness reduction process (also referred to as a thinning process) is performed to reduce a thickness of the substrate 402. More specifically, a substrate thickness reduction process is performed at the back surface 406 of the substrate 402, thereby reducing the thickness, $T_1$, to a thickness, $T_2$. In an example, the thickness, $T_2$, of the substrate 402 is about 1.8 μm to about 2.3 μm. In an example, the substrate thickness reduction process is performed at the back surface 406 of the substrate 402 until the doped region 414 is reached. The substrate thickness reduction process may implement a multi-step process, for example, a multi-step process that includes grinding, polishing, and etching (dry etching, wet etching, or a combination thereof).

Figure 6:
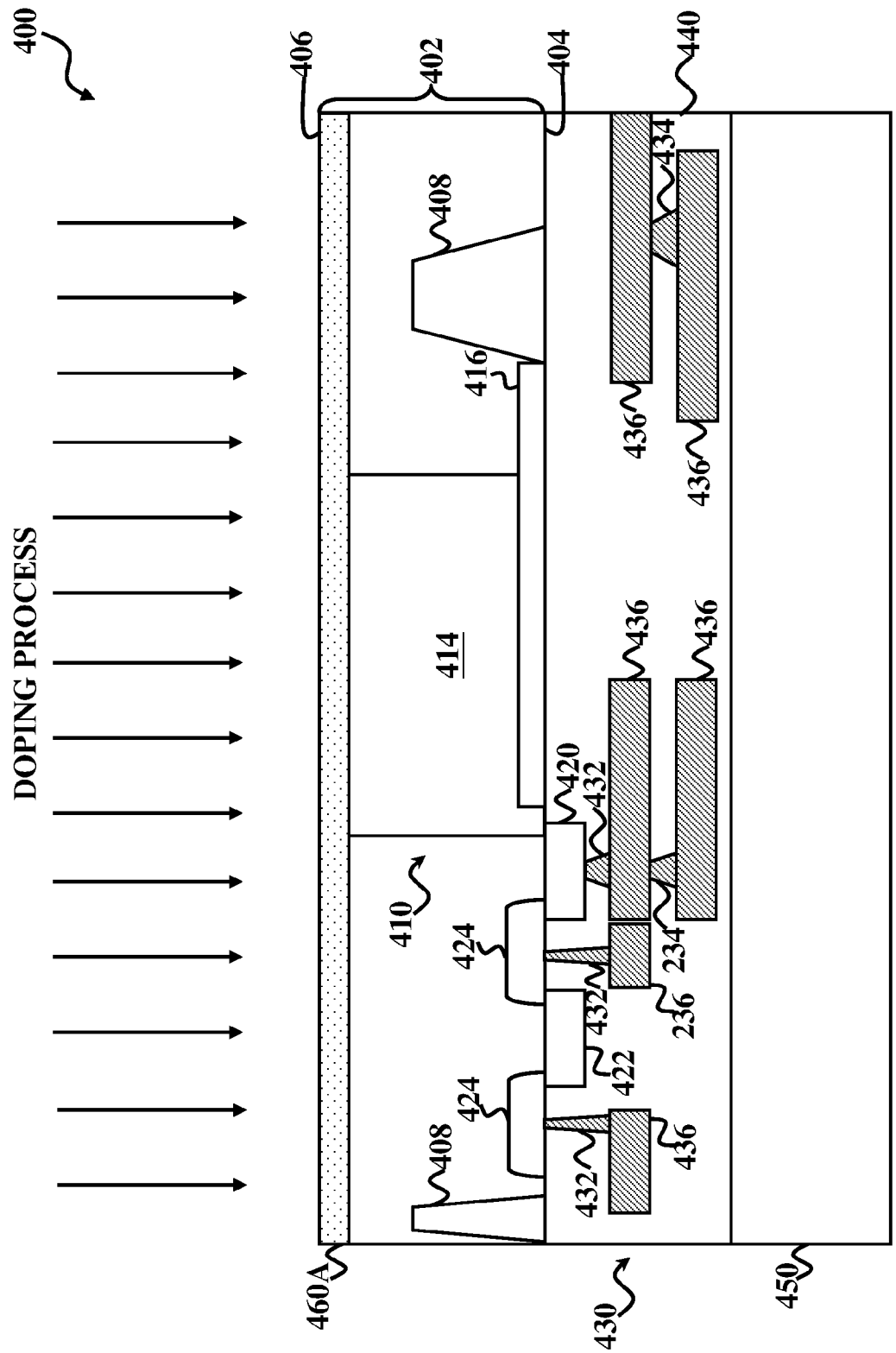

In FIG. 6, a doping process is performed to form a dopant region 460A disposed at the back surface 406 of the substrate 402. The dopant region 460A includes dopants introduced into the substrate 402 by the doping process. In the depicted embodiment, the doping process is an ion implantation process that implants p-type dopants, such as boron or $BF_2$. Alternatively, the ion implantation process implants n-type dopants. The doping process may implement a diffusion process or other process to form the dopant region 460A. The dopant region 460A includes a dopant depth, a dopant concentration, a dopant profile, or combination thereof that can increase quantum efficiency, reduce dark current, and/or reduce white pixel defects of the image sensor device. In the depicted embodiment, the dopant depth, the dopant concentration, and the dopant profile are optimized to reduce dark current in the image sensor device.

Figure 7:
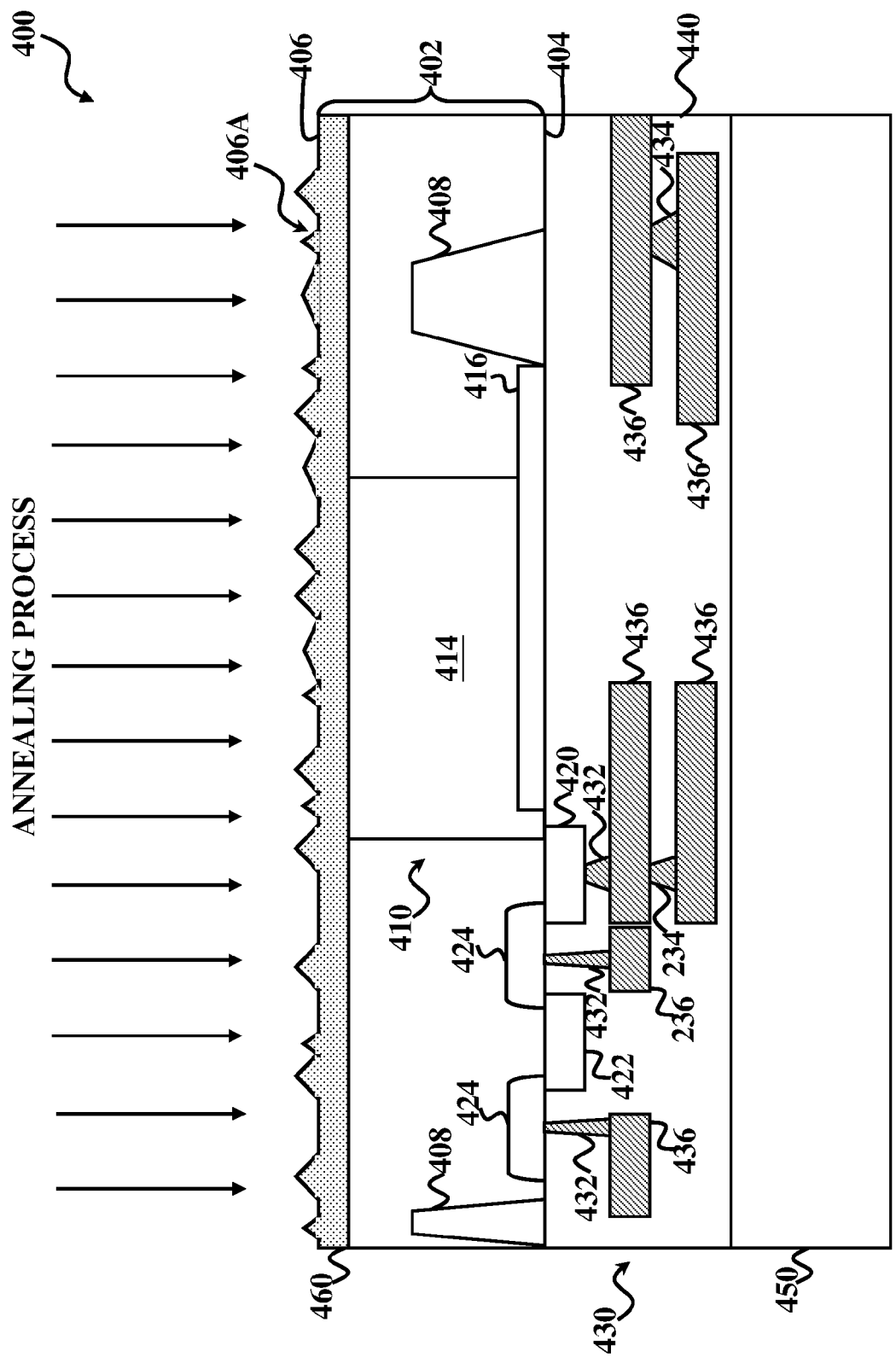

In FIG. 7, an annealing process is performed to activate the dopants in dopant region 460A, thereby forming the doped layer 460. In the depicted embodiment, the annealing process is a laser annealing process. Process parameters (such as time and temperature) of the laser annealing process may be optimized to minimize roughness arising at the back surface 406 of the substrate 402. In one embodiment, a green light laser is used, with an annealing temperature greater than or equal to about 1100° C. for a duration of about 100 to about 400 nsec. This type of anneal process produces a relative shallow depth anneal, such that any metal layers on the front surface 404 of the substrate 402 are not melted or otherwise modified. In some embodiments, the laser annealing process may still result in a roughness 406A of the back surface 406 of the substrate 402. Such roughness 406A can affect image quality of the image sensor device. For example, such roughness 406A may cause a striped pattern to appear in images produced by the image sensor device. The roughness 406A of the surface 406 may be determined using atomic force microscopy. In an example, atomic force microscopy evaluates various defects in the surface 406 of the substrate 402 (for example, peak-to-valley distances of the various defects of in the surface within a center of the substrate 402 and within an edge of the substrate 406) to determine a value representative of the surface roughness 406A. Such value may be a statistical representation of the surface roughness 406A. In the depicted embodiment, the surface roughness 406A is about 0.02 μm to about 0.06 μm. Further, in the depicted embodiment, a total thickness variation of the substrate 402 is greater than about 0.2 μm. Alternatively, the annealing process is a rapid thermal annealing (RTA) process or other annealing process.

Figure 8:
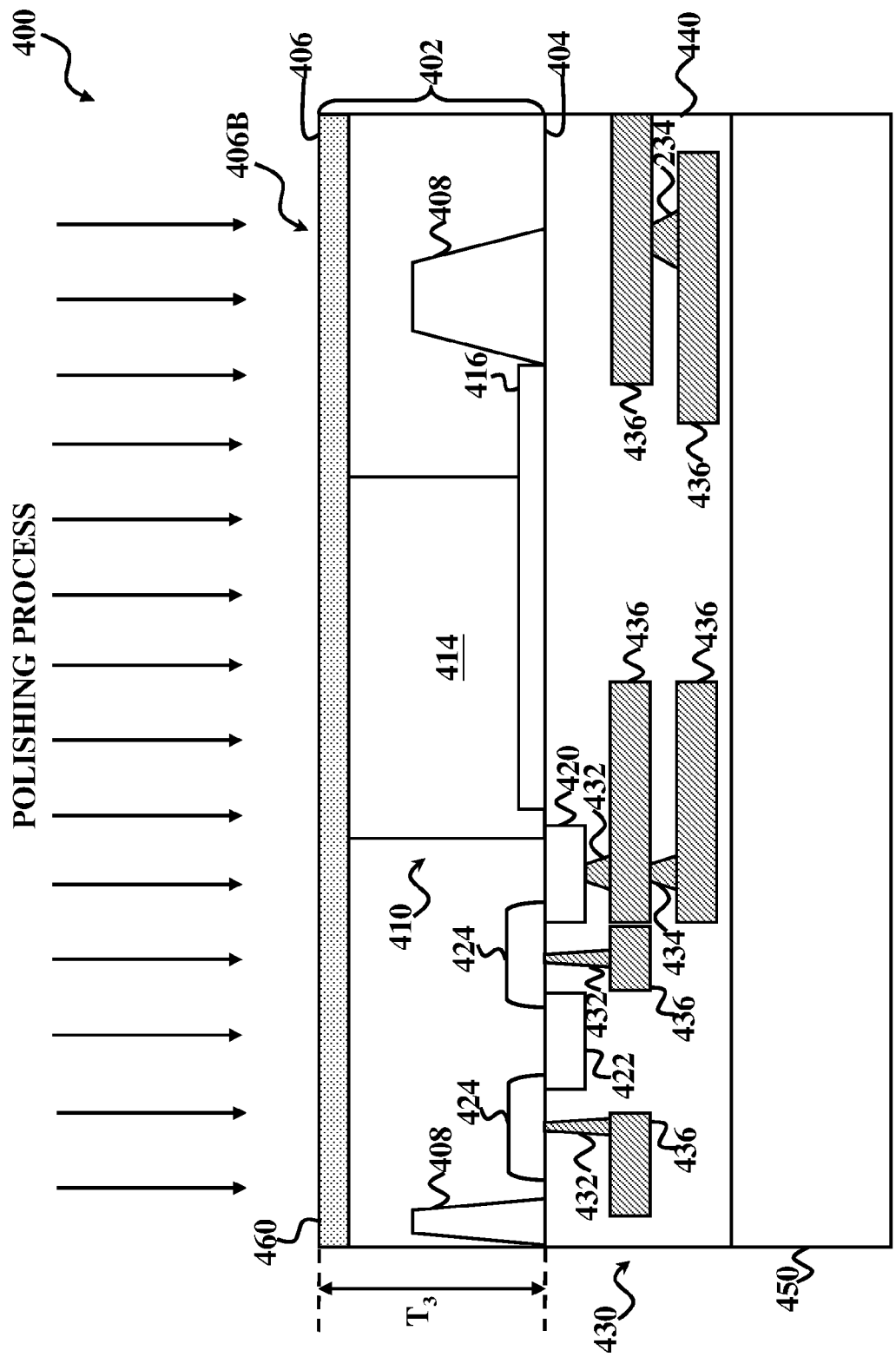

In FIG. 8, a polishing process, such as a chemical mechanical polishing process, is performed on the back surface 406 of the substrate 402, thereby reducing a roughness of the back surface 406. For example, the polishing process reduces the roughness 406A to a roughness 406B. In the depicted embodiment, the surface roughness 406B is less than about 0.02 μm. In another example, the roughness 406B is less than or equal to about 0.02 μm. In yet another example, the roughness is less than or equal to about 0.01 μm. Process parameters of the polishing process (such as polishing rate, polishing time, polishing down force, type of slurry, other process parameter, or combination thereof) may be optimized to achieve a desired or acceptable roughness 406B of the back surface 406 of the substrate 402. In an example, a polishing rate (and/or applied down force) of the polishing process is predetermined, and a time of the polishing process is determined based on the roughness 406A of the back surface 406 of the substrate 402. For example, the polishing rate may be set at about 40 rpm to about 70 rpm, the polishing down force may be set at about 0.5 psi to about 1.5 psi, and the polishing time may be set to achieve the roughness 406B. In another example, the polishing rate and time are optimized to achieve the roughness 406B. The polishing process may use more than one slurry type. For example, the polishing process uses a first slurry of a first size and then uses a second slurry of a second size that is less than the first size. The first slurry of the first size may be used for a main polish, and the second slurry of the second size may be used for a cleaning process. In an example, the first slurry size is less than or equal to about 70 μm and greater than about 35 μm, and the second slurry size is less than or equal to about 35 μm. In another example, the first slurry size is greater than or equal to about 70 μm, and the second slurry size is less than about 70 μm, such as about 35 μm.

In the depicted embodiment, the polishing process removes a portion of the substrate 402 having a thickness that provides optimal image quality for the image sensor device while maintaining improvements to the image quality provided by the doped layer 460, such as reduced dark current. For example, the polishing process removes a portion of the substrate 402 having a thickness of about 0.02 μm to about 0.1 μm. It has been observed that such thickness range removal can provide optimal image quality for the image sensor device of the integrated circuit device 400. For example, if the removed portion has a thickness less than or equal to about 0.02 μm, the surface roughness (such as surface roughness 406A) is not reduced sufficiently to improve image quality (for example, by eliminating a striped pattern in the image produced by the image sensor device), and if the removed portion has a thickness greater than or equal to about 0.1 μm, the optimization of the doped layer disposed at the back surface of the substrate (such as the doped layer 460 disposed at the back surface 406 of the substrate 402) may be negatively affected (for example, reduction in dark current provided by the doped layer may be minimized). Further, in the depicted embodiment, a total thickness variation of the substrate 402 is less than or equal to about 0.2 μm.

Figure 9:
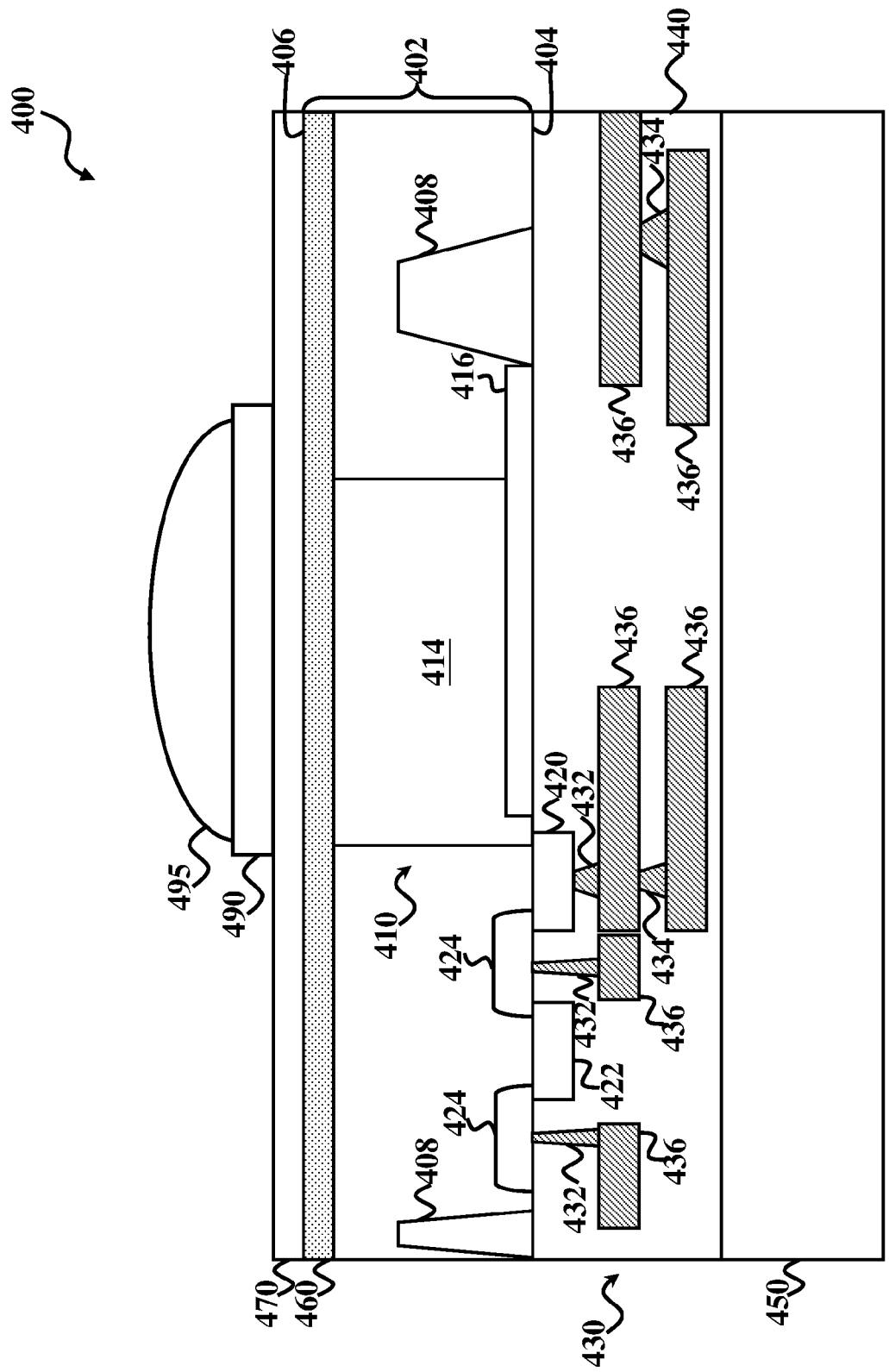

In FIG. 9, various features are formed over the back surface 406 of the substrate 402. For example, an antireflective layer 470, a color filter 490, and a lens 495 are formed over the back surface 406 of the substrate 402. The antireflective layer 470, the color filter 490, and the lens 495 are respectively similar to the antireflective layer 270, the color filter 290, and the lens 295 described above.

The integrated circuit device 400 illustrated in FIG. 9 operates similarly to the integrated circuit device 200 described above. However, the integrated circuit device 400 provides improved image quality compared to the integrated circuit device 200. Such improved image quality is achieved by the reduced (or eliminated) roughness of the back surface of the substrate (such as reduced (or eliminated) roughness of the back surface 406 of the substrate 402), which as described above, is obtained by polishing the back surface of the substrate after the annealing process. The polishing process may also effectively remove other process defects or particles at the back surface of the substrate, which can enhance image quality. Further, such polishing process is easily implemented in conventional integrated circuit device fabrication, providing a cost-effective and time-effective solution to improving image quality of image sensor devices. Different embodiments may have different advantages, and no particular advantage is necessarily required of any embodiment.

The present disclosure provides for many different embodiments of methods and device. For example, a method of forming an image sensor device includes forming a light sensing region at a front surface of a silicon substrate and a patterned metal layer there over. Thereafter, the method also includes performing an ion implantation process to the back surface of the silicon substrate and performing a green laser annealing process to the implanted back surface of the silicon substrate. The green laser annealing process uses an annealing temperature greater than or equal to about 1100° C. for a duration of about 100 to about 400 nsec. After performing the green laser annealing process, a silicon polishing process is performed on the back surface of the silicon substrate.

In another example, a method includes providing a substrate having a first surface and a second surface, the first surface being opposite the second surface; forming a light sensing region at the first surface of the substrate; and forming a metal layer over the first surface. The method further includes forming a doped layer at the second surface of the substrate; and after forming the doped layer, polishing the second surface of the substrate. Forming the doped layer at the second surface of the substrate may include performing a laser annealing process such as a green laser anneal with an annealing temperature greater than or equal to about 1100° C. for a duration of about 100 to about 400 nsec. The method may further include reducing a thickness of the substrate before forming the doped layer. Reducing the thickness of the substrate includes performing a grinding process, a polishing process, an etching process, or a combination thereof. Polishing the second surface may include performing a chemical mechanical polishing process on the second surface. In an example, polishing the second surface of the substrate removes a portion of the substrate that has a thickness of about 0.02 μm to about 0.1 μm. In an example, polishing the second surface achieves total thickness variation of the substrate of less than or equal to about 0.2 μm. In an example, polishing the second surface of the substrate includes polishing the second surface of the substrate with a first slurry of a first size; and polishing the second surface of the substrate with a second slurry of a second size, the second size being less than the first size. A polishing time of the polishing process may be determined based on a surface roughness of the second surface.

In yet another example, a method includes providing a substrate having a front surface and a back surface; forming a light sensing region at the front surface of the substrate; implanting a dopant at the back surface of the substrate; performing an annealing process to activate the dopant, such that the implanting and the annealing process form a doped layer disposed at the back surface of the substrate, but does not affect any structures or layers on the front surface of the substrate. After annealing, the back surface of the substrate is polished. The method may further include after polishing the back surface of the substrate, forming a color filter and a lens over the back surface of the substrate, wherein the color filter and lens are aligned with the light sensing region. The method may further include reducing a thickness of the substrate before implanting the dopant at the back surface of the substrate. In an example, the method further includes, after the annealing process, determining a surface roughness of the back surface of the substrate; and determining a polishing time based on the determined surface roughness of the back surface of the substrate. In an example, the annealing process is a laser annealing process. In an example, the polishing uses a chemical mechanical polishing process on the back surface. Polishing the back surface of the substrate may reduce a surface roughness of the back surface of the substrate. Polishing the back surface of the substrate may include removing a portion of the substrate having a thickness of about 0.02 μm to about 0.1 μm. In an example, the substrate includes silicon and the polishing the back surface includes performing a silicon polishing process.

An embodiment of an image sensor device includes a silicon substrate having a front surface and a back surface. A light sensing region is formed at the front surface of the silicon substrate. The back surface of the silicon substrate is doped, and includes a surface roughness less than about 0.06 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising providing a substrate having a first surface and a second surface, the first surface being opposite the second surface;
    forming a light sensing region at the first surface of the substrate;
    forming a metal layer above the first surface of the substrate;
    forming a doped layer at the second surface of the substrate using a laser annealing process; and
    performing a chemical mechanical polishing process on the annealed, doped layer.

2. The method of claim 1 wherein the laser annealing process is selected to provide a shallow depth anneal that does not modify the metal layer.

3. The method of claim 1 wherein the laser annealing process uses a green light laser.

4. The method of claim 1 wherein the laser annealing process uses an annealing temperature greater than or equal to about 1100° C. for a duration of about 100 to about 400 nsec.

5. The method of claim 1 wherein the performing the polishing process on the annealed, doped layer includes removing a portion of the doped layer, wherein the removed portion of the substrate has a thickness of about 0.02 µm to about 0.1 µm.

6. The method of claim 1 wherein the performing the polishing process on the annealed, doped layer includes:
    polishing the second surface of the substrate with a first slurry of a first size; and
    polishing the second surface of the substrate with a second slurry of a second size, the second size being less than the first size.

7. The method of claim 6 wherein the first size of the first slurry is between about 35 µM to about 70 µm, and the second size of the second slurry is less than about 35 µm.

8. The method of claim 1 wherein the performing the polishing process on the annealed, doped layer includes achieving total thickness variation of the substrate of less than or equal to about 0.2 µm.

9. The method of claim 1 wherein the performing the polishing process on the annealed, doped layer includes achieving a roughness of the second surface that is less than or equal to about 0.06 µm.

10. The method of claim 1 further comprising reducing a thickness of the substrate before forming the doped layer.

11. A method comprising:
    providing a substrate having a front surface and a back surface;
    forming a light sensing region at the front surface of the substrate;
    forming a layer above the front surface of the substrate;
    implanting a dopant at the back surface of the substrate;
    performing an annealing process to activate the dopant, such that the implanting and the annealing process form a doped layer disposed at the back surface of the substrate, wherein the annealing process is of a relatively shallow depth in that it does not modify the layer above the front surface of the substrate; and
    after annealing, performing a polishing process on the back surface of the substrate.

12. The method of claim 11 wherein the performing the annealing process includes performing a laser annealing process.

13. The method of claim 11 wherein the laser annealing process uses a green light laser.

14. The method of claim 13 wherein the laser annealing process uses an annealing temperature greater than or equal to about 1100° C. for a duration of about 100 to about 400 nsec.

15. The method of claim 11 wherein the performing the polishing process includes performing a chemical mechanical polishing process on the back surface.

16. The method of claim 11 wherein the performing the polishing process includes reducing a surface roughness of the back surface of the substrate to less than about less than about 0.06 µm.

17. The method of claim 11 further including:
    after the annealing process, determining a surface roughness of the back surface of the substrate; and
    determining a polishing time based on the determined surface roughness of the back surface of the substrate, wherein the performing the polishing process is performed for the polishing time.

18. A method comprising:
    providing a substrate having a front surface and a back surface;
    forming a light sensing region at the front surface of the substrate;
    implanting a dopant at the back surface of the substrate;
    performing an annealing process to activate the dopant, such that the implanting and the annealing process form a doped layer disposed at the back surface of the substrate;
    after the annealing process, determining a surface roughness of the back surface of the substrate;
    determining a polishing time based on the determined surface roughness of the back surface of the substrate and
    after determining a polishing time, polishing the back surface of the substrate.

19. The method of claim 18 further comprising:
    forming a layer above the front surface of the substrate;
    wherein the annealing process is a green light laser anneal process that anneals to a relatively shallow depth so that it does not modify the layer above the front surface of the substrate.

* * * * *